United States Patent
Lee

(10) Patent No.: US 7,095,656 B2
(45) Date of Patent: Aug. 22, 2006

(54) METHOD OF ERASING NAND FLASH MEMORY DEVICE

(75) Inventor: Keun Woo Lee, Yongin-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 82 days.

(21) Appl. No.: 11/007,183

(22) Filed: Dec. 9, 2004

(65) Prior Publication Data

US 2005/0185471 A1    Aug. 25, 2005

(30) Foreign Application Priority Data

Feb. 25, 2004    (KR) ...................... 10-2004-0012714

(51) Int. Cl.
*G11C 11/34* (2006.01)

(52) U.S. Cl. .......................... 365/185.29; 365/185.27; 365/185.23

(58) Field of Classification Search ........... 365/185.29, 365/185.27, 185.23, 185.17
See application file for complete search history.

(56) References Cited

U.S. PATENT DOCUMENTS

| 5,640,123 | A | * | 6/1997 | Akaogi et al. | ............... 327/534 |
| 5,659,505 | A | * | 8/1997 | Kobayashi et al. | ..... 365/185.29 |
| 6,044,017 | A | * | 3/2000 | Lee et al. | .............. 365/185.18 |
| 2005/0248993 | A1 | * | 11/2005 | Lee et al. | .............. 365/185.29 |

* cited by examiner

*Primary Examiner*—Anh Pgung
(74) *Attorney, Agent, or Firm*—Mayer, Brown, Rowe and Maw LLP

(57) ABSTRACT

Provided is concerned with a method of erasing a NAND flash memory device, capable of restraining an erasing disturbance fail arising from a deselected cell block and improving a product yield of the device by applying a negative voltage to a well of a high voltage transistor forming an X-decoder during an erasing operation in the NAND flash memory device.

5 Claims, 5 Drawing Sheets

METHOD OF ERASING NAND FLASH MEMORY DEVICE

BACKGROUND

1. Field of the Invention

The present invention is related to a method of erasing a NAND flash memory device and particularly, to a method of erasing which is able to improve a protecting function for erasing disturbance fails.

2. Discussion of Related Art

Data stored in a NAND flash memory device is erased in the unit of block. During this, there is no disturbance because a non-erased block is boosted such that a wordline of memory cells is supplied with 20V that is offset with a well bias 20V.

However, when a high voltage transistor employed in an X-decoder is conditioned in an abnormal state, a leakage current is generated and increases up to several tens through hundreds pA/$\mu$m. As a result, the bias voltage of 20V boosted at a gate of a non-erased memory cell decreases under 13V, so that information stored in the memory cell is lost due to disturbance by an erasing bias voltage of 20V set in a sell of a memory cell array.

FIG. 1 is a schematic diagram illustrating a conventional problem.

Referring to FIG. 1, while a gate of a non-selected memory cell A is required to be boosted and conditioned on 20V, there is a voltage drop due to a leakage current arising from a high voltage NMOS transistor B used as a selection transistor. Such a leakage current is generated from various reasons. Especially, a junction region of the high voltage NMOS transistor highly acts as the source of the leakage current (refer to the region L shown in FIG. 1).

Therefore, when the leakage current makes a voltage boosted for a control gate of a memory cell down more than 7V from its original voltage level, it causes a disturbance effect in a deselected cell block and then results in a serious problem that memory cells to be programmed are undesirably forced to be erased.

SUMMARY OF THE INVENTION

The present invention is directed to solve the aforementioned problem, providing a method of erasing a NAND flash memory device capable of restraining an erasing disturbance fail by preventing a leakage current from applying a negative voltage to a well of a high voltage transistor forming an X-decoder.

One aspect of the present invention is to provide a method of erasing data stored in a NAND flash memory device including a plurality of cell block having a plurality of cell string, and a plurality of X-decoder constructed of a plurality of high voltage transistor, applying a leakage protection voltage is applied to a well of the high voltage transistors in the X-decoder during an erasing operation for removing data of one of the cell blocks.

The present invention also provides a method of erasing data stored in a NAND flash memory device including plural cell blocks each having cell strings, bit lines, word lines, string selection transistors connected between the cell strings and the bit lines, and ground selection transistors connected between the cell strings and a common ground line, and plural X-decoders each having gate string selection high voltage transistors for applying predetermined gate voltages to the string selection transistors, the ground selection transistors, and gate terminals of the memory cells, gate ground selection high voltage transistors, and cell gating high voltage transistors, selecting one of the cell blocks for an erasing operation; applying a power supply voltage to gate terminals of the gate string selection high voltage transistor, the gate ground selection high voltage transistor, and the cell gating high voltage transistor in the X-decoder coupled to the selected cell block, applying a leakage protection voltage to a well of the high voltage transistors, and applying a floating voltage to drain terminals of the gate string selection high voltage transistor and the gate ground selection transistor; applying a ground voltage to a drain terminal of the cell gating high voltage transistor, gate terminals of the gate string selection high voltage transistor, the gate ground selection high voltage transistor, and the cell gating high voltage transistor, of the X-decoder coupled to a deselected cell block, and applying a leakage protection voltage to the well; and applying an erasing voltage to the well of the plural cell blocks.

Preferably, the leakage protection voltage is in the range of 0.1~–1.0 V.

Preferably, the floating voltage is in the range of 3.5~5.5 V while the erasing voltage is in the range of 20~22 V.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings:

FIG. 3A is a schematic diagram illustrating a voltage applied to a high voltage transistor of an X-decoder in a cell block to be erased, while

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

In order to regulate a leakage current generated from a high voltage transistor used in a conventional X-decoder less than 1 pA/$\mu$m, it may be required to set a threshold voltage of the high voltage transistor over 0.75 V or to use a negative voltage therein.

First, considering the case of elevating the threshold voltage of the high voltage transistor used in the X-decoder, a higher back-bias effect causes a voltage used in a programming operation to be lowered more than 0.7V when the high voltage transistor is used for a pass transistor functioning as a high voltage hump. As this case results in degradation of a program speed, there is a limit to increasing the threshold voltage for protecting the leakage current.

Now, it will be described about the feature of applying a negative bias to a well in conjunction with the accompanying drawings.

Figure 2:
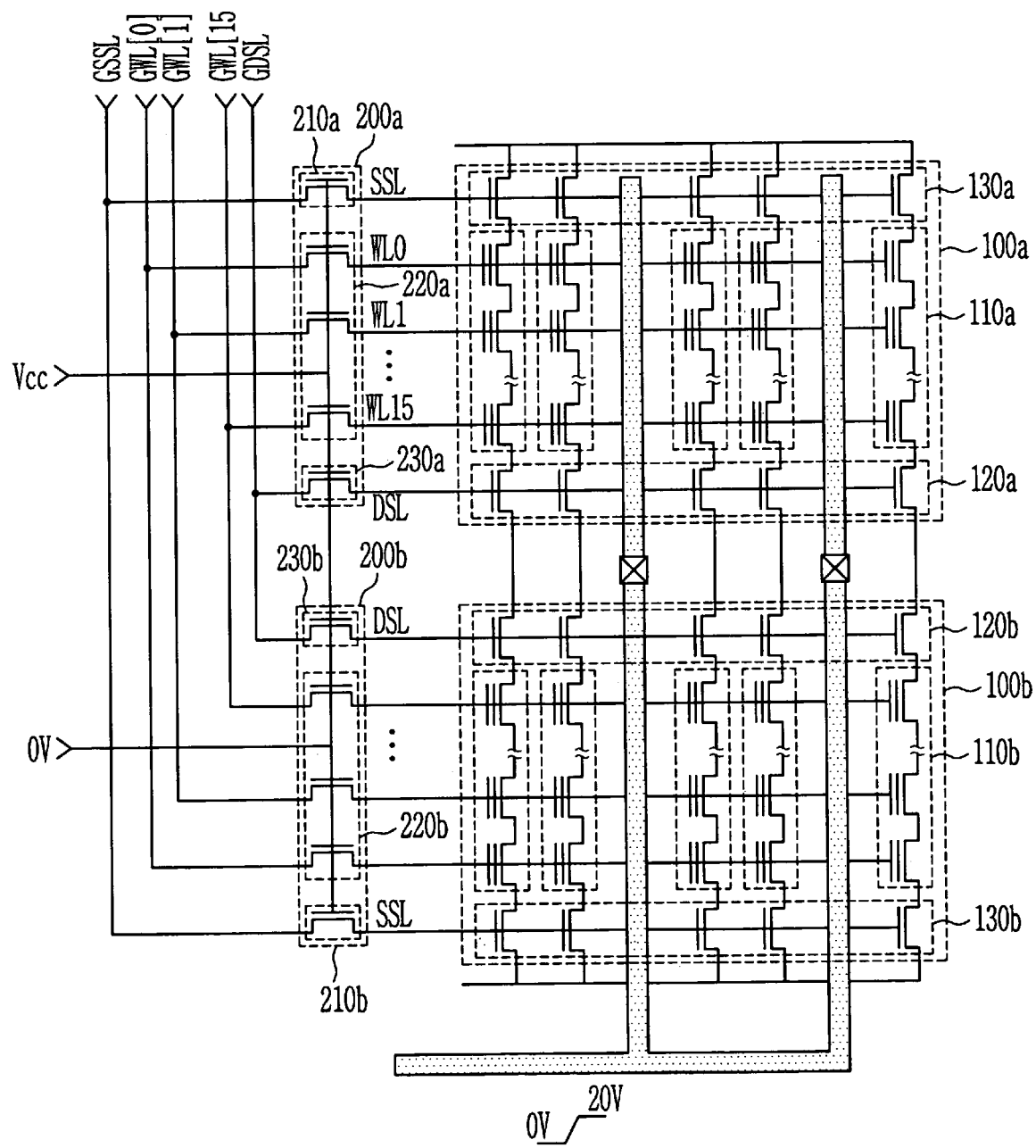
FIG. 2 is a schematic diagram illustrating a method of erasing a NAND flash memory device in accordance with the present invention.

FIG. 2 is a schematic diagram illustrating a method of erasing a NAND flash memory device in accordance with the present invention.

Figure 3A:
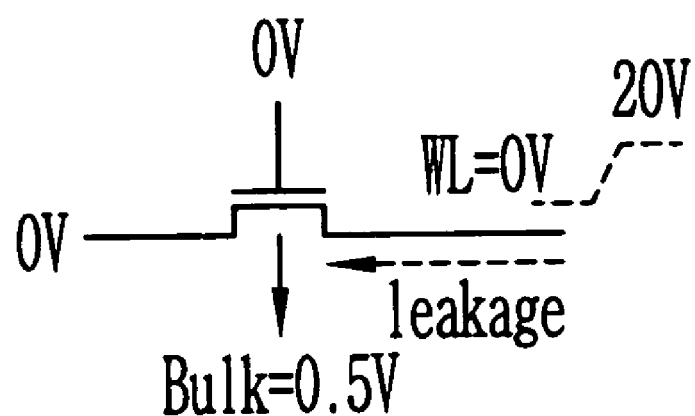
Figure 3B:
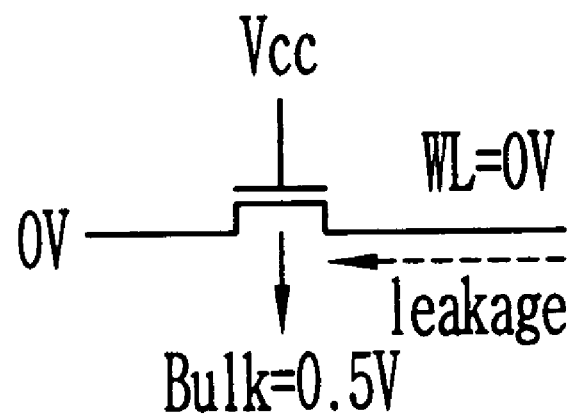
FIG. 3B is a schematic diagram illustrating a voltage applied to a high voltage transistor of an X-decoder in a cell block to be non-erased.

FIG. 3A is a schematic diagram illustrating a voltage applied to a high voltage transistor of an X-decoder in a cell block to be erased, while FIG. 3B is a schematic diagram illustrating a voltage applied to a high voltage transistor of an X-decoder in a cell block to be non-erased.

Referring to FIGS. 2, 3A, and 3B, in a NAND flash memory device including a plurality of cell block 100 having a plurality of cell string 110, and a plurality of X-decoder 200 constructed of a plurality of high voltage transistor for applying a predetermined voltage to word lines WL of the cell block 100, a leakage protection voltage is applied to a well of the high voltage transistors in the X-decoder 200 during an erasing operation for removing data of one of the cell blocks 100.

In detail, in the NAND flash memory device is comprised of the plural cell blocks 100 each including the cell strings 110, bit lines, word lines, string selection transistors 120 connected between the cell strings and the bit lines, and ground selection transistors 130 connected between the cell strings 110 and a common ground line, and the plural X-decoders 200 each including gate string selection high voltage transistors 230 for applying predetermined gate voltages to the string selection transistors 120, the ground selection transistors 130, and gate terminals of the memory cells, gate ground selection high voltage transistors 210, and cell gating high voltage transistors 220, after selecting one of the cell blocks 100 for an erasing operation, first a power supply voltage is applied to gate terminals of the gate string selection high voltage transistor 230a, the gate ground selection high voltage transistor 210a, and the cell gating high voltage transistor 220a in the X-decoder 200a coupled to the selected cell block. Next, a leakage protection voltage is applied to a well of the high voltage transistors. And, floating voltages GDSL and GSSL are applied to drain terminals of the gate string selection high voltage transistor 230a and the gate ground selection transistor 210a. A ground voltage is applied to a drain terminal of the cell gating high voltage transistor 220a, gate terminals of the gate string selection high voltage transistor 230b, the gate ground selection high voltage transistor 210b, and the cell gating high voltage transistor 220b, of the X-decoder 200b connected to the deselected cell block 100b. The leakage protection voltage is applied to the well and an erasing voltage is applied to the well of the plural cell blocks 200.

The cell string 110 is preferably composed of 16 memory cells in the pattern of string. Thus, the X-decoder 200 coupled to word lines, i.e., gate terminals of the cell string 110, is constructed of 16 cell gating high voltage transistors 220.

It is also preferred for the leakage protection voltage to be set in the range of −0.1~−1.0 V in order to prevent a leakage current from generating in the well of the high voltage transistors used in the X-decoder 200 selecting the memory cells in the NAND flash memory device. It is more effective for the leakage protection voltage to be set in the range of −0.4~−0.6 V. By applying the leakage protection voltage, the leakage current can be reduced more than fifty times, which will be described later in detail referring to a graph. It is preferred to generate the leakage protection voltage by means of an additional negative charge pump. It is preferred to use a regulator for dividing the voltage. It is effective to use a high voltage in the range of 20 through 22 V for the erasing voltage applied to the cell block 100. It is preferred for the floating voltage to be set in the range of 3.5~5.5 V, effectively in the range of 4.0~5.0 V.

Table 1 arranges the voltage applied to the NAND flash memory device in accordance with the present invention.

TABLE 1

|  |  | Voltage of selected region | Voltage of deselected region |
|---|---|---|---|
| Cell block | BL | 0 V | 0 V |
|  | Bulk | 21 V | 21 V |
| X-decoder | GWL | 0 V | 0 V |
|  | GDSL | 4.5 V | 4.5 V |
|  | GSSL | 4.5 V | 4.5 V |
|  | Vg | Vcc | 0 V |
|  | Bulk | −0.5 V | −0.5 V |

Figure 1:
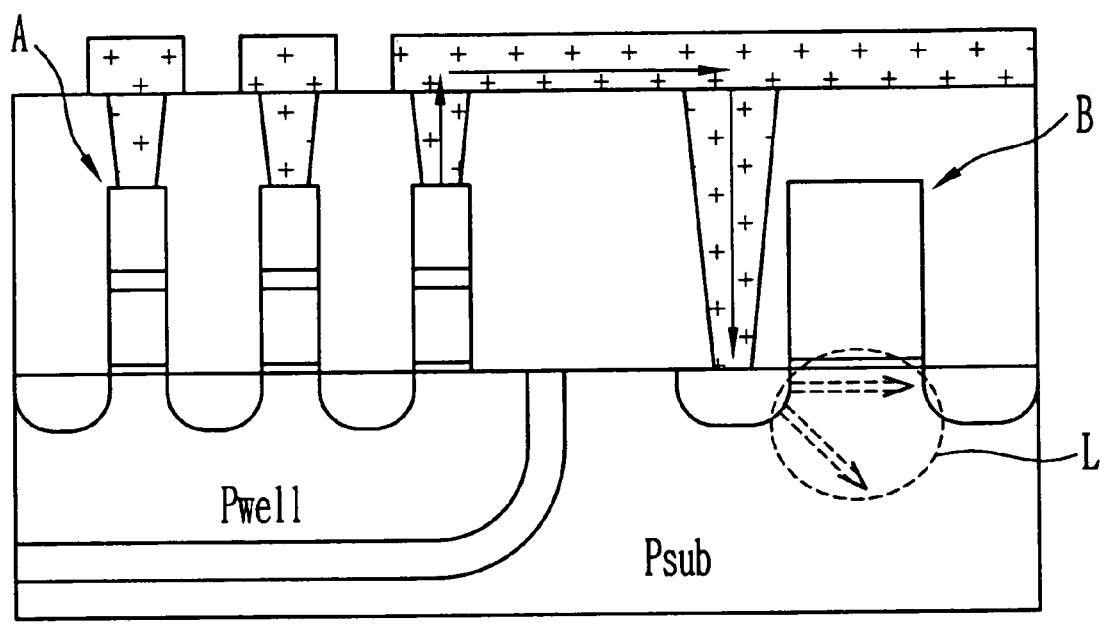
FIG. 1 is a schematic diagram illustrating a conventional problem.

Referring to FIG. 1, 0 V is applied to a bit line of the selected cell block 100a and a word line of the cell block 100a through the X-decoder 200a. And, after floating the string selection transistor 120a and the ground selection transistor 130a, the erasing voltage is applied to the well of the cell block 100a to prosecute an erasing operation. For this erasing operation, the power supply voltage Vcc is applied to the gate terminal of the high voltage transistor in the X-decoder 200a, while −0.5 V is applied to the well thereof. And, 4.5 V is applied to the drain terminals of the high voltage transistors 210a, 220a, and 230a which are connected to the string selection transistor 120a and the ground selection transistor 130a. Thereby, the gate terminals of the string selection transistor 120a and the ground selection transistor 130a are charged to Vcc-Vt, which turns the selection transistors 120a and 130a off. The ground (source) and string (drain) lines of the selected cell block are floated.

Meanwhile, bit lines of the deselected cell block 100b are supplied with 0 V and word lines of the deselected cell block 100b are floated by the X-decoder 200b. Thus, there is no operation of erasing in the deselected cell block 100b even though the erasing voltage is applied to the well of the deselected cell block 100b. For the condition, the ground voltage is applied to the gate terminals of the high voltage transistor belonging to the X-decoder 200b and −0.5 V is applied to the well. As a result, the high voltage transistors are turned off to make word lines of the deselected cell block be floated, which prevents a voltage drop at a boosted memory cell due to a leakage current arising from the high voltage transistors of the X-decoder 200b and thereby protects the erasing disturbance effect.

When a negative voltage of −0.1 V through −1.0 V is applied to the well of the high voltage transistors used in the X-decoder of the NAND flash memory device by means of a negative charge pump, the leakage current by the high voltage transistors can be reduced more than 50 times than before. By way of the procedure, it can restrain the erasing disturbance fails and improve a product yield of the NAND flash memory device.

Figure 4:
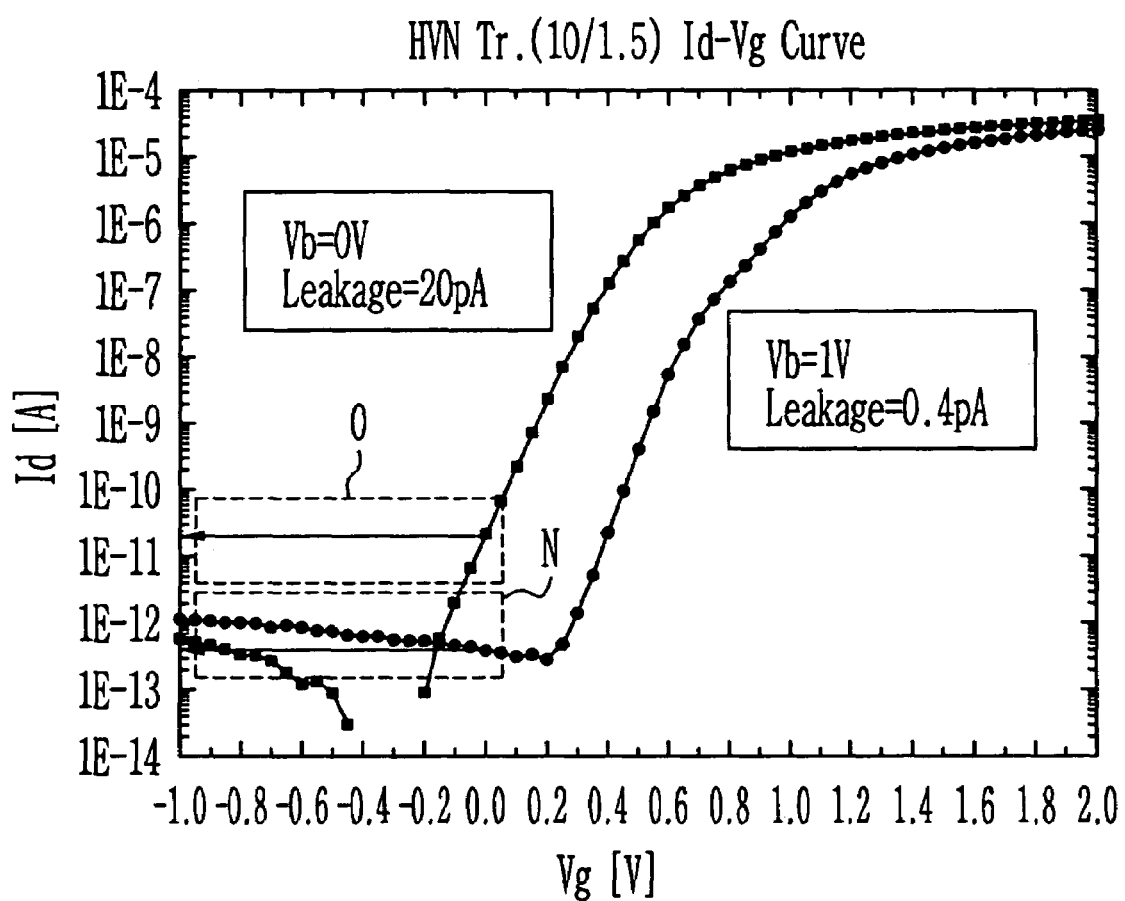
FIGS. 4 and 5 are graphic diagrams depicting leakage currents in high voltage elements in accordance with the present invention.
Figure 5:
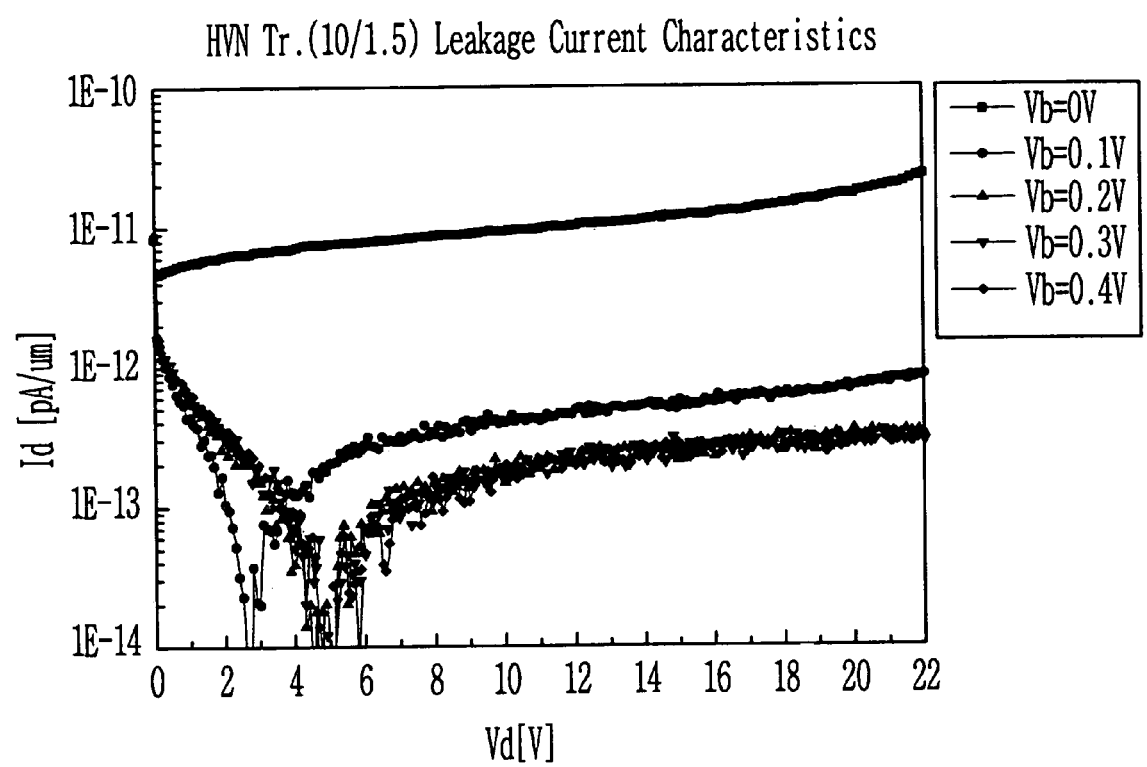

FIGS. 4 and 5 are graphic diagrams depicting leakage currents in high voltage elements in accordance with the present invention.

As illustrated in FIG. 4, when a back bias is applied to the well of the high voltage transistors, a leakage current is generated about 20 pA (see the region O of FIG. 4). Otherwise, when −1 V is applied thereto as a well bias voltage, the leakage current is generated about 0.4 pA (see the region N of FIG. 4). Also, referring to FIG. 5, it can be seen that the leakage current abruptly decreases when a negative voltage is applied thereto rather than when 0 V is applied thereto. Therefore, it is possible to sufficiently reduce the leakage current by applying a negative bias voltage just over −0.2 V.

However, there is a limit in applying the negative bias voltage to the well of the high voltage transistors because the high voltage transistor is turned on in the condition that the bias voltage must be higher than Vcc−Vt_hvn=1.8−0.85=0.95 V due to the negative well bias at the well of the high voltage transistors. Further, with an increase of the integration density on the device, the well (bulk) bias is force to be more reduced in consideration of a lower power supply voltage. Therefore, it is preferred to maximize the well bias voltage up to 0.95 V for assuring an electrical margin. In the embodiment of the present invention, it is preferred to apply a negative voltage of −0.4~−0.6V to the well of the high voltage transistors used in the X-decoder, which does not affect the operations of the high voltage transistors coupled to the selected memory region as well as effectively preventing the leakage current from the high voltage transistors.

As aforementioned, the present invention is able to restrain an erasing disturbance fail arising from a deselected cell block and improve a product yield of the device by applying a negative voltage to a well of a high voltage transistor forming an X-decoder during an erasing operation in the NAND flash memory device.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of erasing data stored in a NAND flash memory device including a plurality of cell block having a plurality of cell string, and a plurality of X-decoder constructed of a plurality of high voltage transistors, the method comprising:

applying a leakage protection voltage is applied to a well of the high voltage transistors in the X-decoder during an erasing operation for removing data of one of the cell blocks.

2. The method according to claim 1, wherein the leakage protection voltage is in the range of −0.1~−1.0 V.

3. A method of erasing data stored in a NAND flash memory device including plural cell blocks each having cell strings, bit lines, word lines, string selection transistors connected between the cell strings and the bit lines, and ground selection transistors connected between the cell strings and a common ground line, and plural X-decoders each having gate string selection high voltage transistors for applying predetermined gate voltages to the string selection transistors, the ground selection transistors, and gate terminals of the memory cells, gate ground selection high voltage transistors, and cell gating high voltage transistors, the method comprising:

selecting one of the cell blocks for an erasing operation;

applying a power supply voltage to gate terminals of the gate string selection high voltage transistor, the gate ground selection high voltage transistor, and the cell gating high voltage transistor in the X-decoder coupled to the selected cell block, applying a leakage protection voltage to a well of the high voltage transistors, and applying a floating voltage to drain terminals of the gate string selection high voltage transistor and the gate ground selection transistor;

applying a ground voltage to a drain terminal of the cell gating high voltage transistor, gate terminals of the gate string selection high voltage transistor, the gate ground selection high voltage transistor, and the cell gating high voltage transistor, of the X-decoder coupled to a deselected cell block, and applying a leakage protection voltage to the well; and applying an erasing voltage to the well of the plural cell blocks.

4. The method according to claim 3, wherein the leakage protection voltage is in the range of −0.1~−1.0 V.

5. The method according to claim 3, wherein the floating voltage is in the range of 3.5~5.5 V while the erasing voltage is in the range of 20~22 V.

* * * * *